US010168429B2

(12) United States Patent
Maleki et al.

(10) Patent No.: US 10,168,429 B2
(45) Date of Patent: Jan. 1, 2019

(54) COMPACT LIDAR SYSTEM

(71) Applicant: GM GLOBAL TECHNOLOGY OPERATIONS LLC, Detroit, MI (US)

(72) Inventors: Lutfollah Maleki, Pasadena, CA (US); Andrey B. Matsko, Pasadena, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 455 days.

(21) Appl. No.: 15/092,134

(22) Filed: Apr. 6, 2016

(65) Prior Publication Data

US 2016/0299228 A1  Oct. 13, 2016

Related U.S. Application Data

(60) Provisional application No. 62/143,912, filed on Apr. 7, 2015.

(51) Int. Cl.
*G01C 3/08* (2006.01)
*G01S 17/32* (2006.01)
(Continued)

(52) U.S. Cl.
CPC .......... *G01S 17/325* (2013.01); *G01S 7/4911* (2013.01); *G01S 17/42* (2013.01); *G01S 17/89* (2013.01);
(Continued)

(58) Field of Classification Search
CPC ... G02F 1/00123; G02F 1/011; G02F 2203/15
See application file for complete search history.

(56) References Cited

U.S. PATENT DOCUMENTS 4,314,210 A * 2/1982 Everett .................. H01S 3/083
  372/18
5,544,268 A * 8/1996 Bischel .................. G02F 1/011
  385/16
(Continued)

FOREIGN PATENT DOCUMENTS

WO  2009/051730 A1  4/2009

OTHER PUBLICATIONS

Liang, W. et al. "Whispering Gallery Mode Resonator Based Ultra-Narrow Linewidth External Cavity Semiconductor Laser." Aug. 5, 2010. https://arxiv.org/pdf/1008.0896.pdf (Year: 2010).*
(Continued)

*Primary Examiner* — Samantha K Abraham
(74) *Attorney, Agent, or Firm* — Medley, Behrens & Lewis, LLC

(57) ABSTRACT

An FM LIDAR system is described that includes a frequency modulated LIDAR system that incorporates a laser source that is optically coupled to a whispering gallery mode optical resonator. Light from the laser that is coupled into the whispering gallery mode optical resonator is coupled back out as a returning counterpropagating wave having a frequency characteristic of a whispering gallery mode of the optical resonator. This returning wave is used to reduce the linewidth of the source laser by optical injection. Modulation of the optical properties of the whispering gallery mode optical resonator results in modulation of the frequency of the frequencies supported by whispering gallery modes of the resonator, and provides a method for producing highly linear and reproducible optical chirps that are highly suited for use in a LIDAR system. Methods of using such an FM LIDAR system and vehicle assisting systems that incorporate such FM LIDAR systems are also described.

33 Claims, 13 Drawing Sheets

(51) Int. Cl.
*G01S 17/42* (2006.01)
*G01S 17/89* (2006.01)
*G01S 17/93* (2006.01)
*G02B 6/293* (2006.01)
*H01S 3/00* (2006.01)
*G01S 7/491* (2006.01)

(52) U.S. Cl.
CPC ........ *G01S 17/936* (2013.01); *G02B 6/29341* (2013.01); *H01S 3/00* (2013.01)

(56) References Cited

U.S. PATENT DOCUMENTS

| | | | | |
|---|---|---|---|---|
| 5,630,004 | A * | 5/1997 | Deacon | G02F 1/011 385/10 |
| 5,911,018 | A * | 6/1999 | Bischel | G02F 1/011 385/11 |
| 6,167,169 | A * | 12/2000 | Brinkman | G02F 1/011 385/10 |
| 7,133,022 | B2 | 11/2006 | Grabert | |
| 8,564,869 | B1 * | 10/2013 | Mohageg | G02F 1/011 359/245 |
| 8,804,787 | B1 | 8/2014 | Coleman et al. | |
| 9,311,374 | B2 | 4/2016 | Darcy et al. | |
| 2002/0018494 | A1 | 2/2002 | Vieira et al. | |
| 2009/0097516 | A1 | 4/2009 | Maleki et al. | |
| 2010/0118375 | A1 | 5/2010 | Maleki et al. | |
| 2013/0003766 | A1 | 1/2013 | Savchnkov et al. | |
| 2014/0158870 | A1 | 6/2014 | DeAntonio et al. | |
| 2014/0192394 | A1 | 7/2014 | Sun et al. | |
| 2014/0294024 | A1 | 10/2014 | Kim | |

OTHER PUBLICATIONS

Sprenger, B. et al. "Whispering-Gallery-Mode-Resonator-Stabilized-Narrow-Linewidth Fiber Loop Laser." Nov. 1, 2009. OSA Publishing, Optics Letters, vol. 34, No. 21. Web address exceeds character limit for PTO-892. (Year: 2009).*
Braje, Danielle A. "Tiny Resonators Generate a Large Optical Spectrum." Sep. 7, 2010. file:///C:/Users/sabraham/Downloads/Physics.3.75.pdf (Year: 2010).*
Satyan, Naresh. "Optoelectronic Control of the Phase and Frequency of Semiconductor Lasers.", Chapter 5 "The Optoelectronic Swept-Frequency Laser". Cal Tech Thesis. 2011. https://thesis.library.caltech.edu/6364/8/Chapter5.pdf (Year: 2011).*
Sendowski, Jacob Benjamin. "On-Chip Integrated Label-Free Optical Biosensing." Cal Tech Thesis, 2013. https://thesis.library.caltech.edu/7812/1/JS_Thesis.pdf (Year: 2013).*
Quack, Niels et al.; Development of an FMCW LADAR Source Chip using MEMS-Electronic-Photonic Heterogeneous-Integration; University of California, Berkeley, USA and University of Illinois at Urbana-Champaign, USA.
World's Most Complex 2D Laser Beamsteering Array Demonstrated; World's Most Complex 2D Laser Beamsteering Array Demonstrated; Jan. 15, 2013.
Breakthroughs in Photonics 2011; IEEE Photonics Journal.

* cited by examiner

COMPACT LIDAR SYSTEM

This application claims priority to provisional application No. 62/143912 filed Apr. 7, 2015. This and all other referenced patents and applications are incorporated herein by reference in their entirety.

FIELD OF THE INVENTION

The field of the invention is LIDAR systems, particularly frequency modulated continuous wave LIDAR systems.

BACKGROUND

The background description includes information that may be useful in understanding the present invention. It is not an admission that any of the information provided herein is prior art or relevant to the presently claimed invention, or that any publication specifically or implicitly referenced is prior art.

LIDAR is increasingly used for distance measurement in a variety of applications, ranging from cartography to microscopy. The incorporation of such functionality into an ever-growing range of devices, including autonomous or semi-autonomous vehicles has led to the development of increasingly compact and low power consumption devices. At the same time, demand for LIDAR devices with increased range and improved resolution continues to grow.

LIDAR can be accomplished in a variety of ways. In "time of flight" (TOF) LIDAR short pulses of light are emitted and reflected pulses received, with the delay between emission and reception providing a measure of distance between the emitter and the reflecting object. Such TOF systems, however, have a number of disadvantages. For example, simple TOF measurements are highly susceptible to interference from other signal sources. This issue becomes more pronounced as the distance between the emitter and the reflecting object increases, as such distance necessarily decreases the strength of the reflected signal. On the other hand, inherent limitations in accurately measuring extremely short time intervals limit the spatial resolution of such TOF LIDAR systems at close range. In addition, the range of such TOF LIDARs is a function of the ability to detect the relatively faint reflected signal. The resulting range limitations are frequently addressed by using highly sensitive photodetectors. In some instances such detectors can detect single photons. Unfortunately this high degree of sensitivity also leads to increased misidentification of interfering signals as reflect TOF LIDAR pulses. Despite these disadvantages TOF LIDAR systems currently find wide application, primarily due to the ability to provide such systems in a very compact format and the ability to utilize relatively inexpensive non-coherent laser light sources.

Alternatives to TOF LIDAR have been developed. One of these, frequency modulated (FM) LIDAR, relies on a coherent laser source to generate repeated brief "chirps" of time delimited, frequency modulated optical energy. The frequency within each chirp varies linearly, and measurement of the phase and frequency of an echoing chirp relative to a reference signal provides a measure of distance and velocity of the reflecting object relative to the emitter. Other properties of the reflected chirp (for example, intensity) can be related to color, surface texture, or composition of the reflecting surface. In addition, such FM LIDARs are relatively immune to interfering light sources (which tend to produce non-modulated signals) and do not require the use of highly sensitive photodetectors.

The accuracy of this measurement depends upon a number of factors, including the linewidth limitations of the emitting laser, the range of frequencies (i.e. bandwidth) within the chirp, the linearity of the frequency change during each chirp, and the reproducibility of individual chirps. Unfortunately, improvement in one of these factors is generally at the detriment of the remaining factors. For example, while increasing the bandwidth of the chirps improves resolution, doing so makes it difficult to maintain linearity of the frequency change within the chirp. Similarly, lasers that have a narrow linewidth can be poorly suited for production of the range frequencies required to generate a chirp. In addition, FM LIDAR systems that have been developed to date are far from compact, as they rely on relatively large FMCW laser sources. In addition, such systems typically rely on a carefully modulated, low noise local oscillator (for example, a narrow linewidth solid state, gas, or fiber laser) with frequency modulation corresponding to that of the emitted chirp provided by a relatively large interferometer. This local oscillator precisely replicates an emitted chirp, and serves as the reference for the received reflected chirp. As a result FM LIDARs are relatively large, complex, and expensive, and have seen limited implementation relative to TOF LIDARs despite their performance advantages.

Quack et at (presentation at GOMACTech, St. Louis, Mo., USA, Mar. 23-26, 2015) have proposed development of a FMCW LIDAR source device that would require construction and integration of an electromechanically modulated laser source, an optical interferometer, and modulating electronics on a single silicon chip. The resulting device however, relies on an electronic feedback system that inherently generates nonlinear optical chirps. This is only partially corrected by applying a "pre-distorting" the feedback signal supplied to the laser source and utilization of an external reference frequency generator that can act as an additional source of variation (Satyan et al, Optics Express vol. 17, 2009). The resulting LIDAR source is highly complex, and it remains to be seen if such diverse features can be successfully integrated on a single silicon chip in a reliable fashion. In addition, a LIDAR incorporating such a source is still reliant on the use of a complex local oscillator to provide useful data.

Thus there is a need for a compact, robust, and efficient LIDAR system that exhibits a high degree of chirp linearity, large chirp bandwidth, and high chirp reproducibility.

The following description includes information that may be useful in understanding the present invention. It is not an admission that any of the information provided herein is prior art or relevant to the presently claimed invention, or that any publication specifically or implicitly referenced is prior art.

SUMMARY OF THE INVENTION

Embodiments of the inventive concept include a frequency modulated LIDAR system that incorporates a laser source that is optically coupled to a whispering gallery mode optical resonator. Light from the laser that is coupled into the whispering gallery mode optical resonator is coupled back out as a returning counterpropagating wave having a frequency characteristic of a whispering gallery mode of the optical resonator. This returning wave is used to reduce the linewidth of the source laser by optical injection. Modulation of the optical properties of the whispering gallery mode optical resonator results in modulation of the frequency of the frequencies supported by whispering gallery modes of the resonator, and provides a method for producing highly linear and reproducible optical chirps that are highly suited for use in a LIDAR system.

One embodiment of the inventive concept is a LIDAR system that includes a laser light source, a modulatable whispering gallery mode resonator that is optically coupled to the laser light source to provide linewidth reduction via optical injection, a transducer that can alter an optical property of the whispering gallery mode optical resonator (for example, refractive index), a controller that controls the transducer, a transmission assembly for transmitting optical chirps generated by the controller, a receiver that receives reflected optical chirps, and a processor that utilizes data derived from the reflected chirps to determine position of an object that is reflecting the chirps. In some embodiments all of these components are provided on a single substrate. The linewidth of the optical injection locked laser source can be less than 1 kHz. In a preferred embodiment, the laser source can also act as the source of a reference chirp that is combined with a reflected chirp in determining position of a reflecting object.

Another embodiment of the inventive concept is a method of utilizing a LIDAR system. In such methods LIDAR system that includes a laser light source, a modulatable whispering gallery mode resonator that is optically coupled to the laser light source to provide linewidth reduction via optical injection, a transducer that can alter an optical property of the whispering gallery mode optical resonator (for example, refractive index), a controller that controls the transducer, a transmission assembly for transmitting optical chirps generated by the controller, a receiver that receives reflected optical chirps, and a processor that utilizes data derived from the reflected chirps to determine position of an object that is reflecting the chirps is provided. A reference chirp that is also produced by the laser source is compared with a chirp reflected by a reflective object within range of the LIDAR system to determine the position of the reflective object.

Another embodiment of the inventive concept is a vehicle assistance system that incorporates a LIDAR system that includes a laser light source, a modulatable whispering gallery mode resonator that is optically coupled to the laser light source to provide linewidth reduction via optical injection, a transducer that can alter an optical property of the whispering gallery mode optical resonator (for example, refractive index), a controller that controls the transducer, a transmission assembly for transmitting optical chirps generated by the controller, a receiver that receives reflected optical chirps, and a processor that utilizes data derived from the reflected chirps to determine position of an object that is reflecting the chirps, and an assistive engine that receives data produced by the LIDAR and that is in communication with a vehicle effector. Such an effector can be a notification system for use by a vehicle operator. In some embodiments the effector is coupled to a transducer that affects vehicle operation (e.g. steering, engine speed, etc.). In some embodiments the vehicle is controlled by an operator, who can be present in the vehicle or operating it remotely. In other embodiments the vehicle is autonomous. Various objects, features, aspects and advantages of the inventive subject matter will become more apparent from the following detailed description of preferred embodiments, along with the accompanying drawing FIG.s in which like numerals represent like components.

BRIEF DESCRIPTION OF THE DRAWINGS

FIG. 4A depicts a spherical optical resonator. FIG. 4B depicts an annular optical resonator with a convex outer face. FIG. 4C depicts a discoidal optical resonator. FIG. 4D depicts annular optical resonator with a planar outer face.

FIG. 5A schematically depicts a discoidal optical resonator with an electrode applied at the perimeter. FIG. 5B schematically depicts a modulated whispering gallery mode optical resonator 560 includes a discoidal optical resonator 565 with electrodes 570, 580 applied to opposing planar faces of the resonator.

FIG. 6A depicts a spherical optical resonator that is optically coupled to waveguides generated on a silicon chip. FIG. 6B depicts a discoidal optical resonator generated on a silicon chip and optically coupled to a waveguide generated on the same silicon chip. The waveguides are in turn optically coupled to an adjacent silicon chip. FIG. 6C depicts a ring optical resonator generated on a silicon chip and optically coupled to a waveguide generated on the same silicon chip. The waveguides are in turn optically coupled to an adjacent silicon chip. FIG. 6D depicts a spherical optical resonator optically coupled to a pair of GRIN lenses, which are in turn optically coupled to waveguides generated on a silicon chip.

FIG. 7A shows changes in optical frequency over time for an emitted optical frequency chirp and a returning, reflected optical frequency chirp. FIG. 7B shows the result of fast Fourier transform processing of typical data.

FIG. 7A shows changes in optical frequency over time for an emitted optical frequency chirp and a returning, reflected optical frequency chirp. FIG. 7B shows the result of fast Fourier transform processing of typical data.

DETAILED DESCRIPTION

Figure 1:
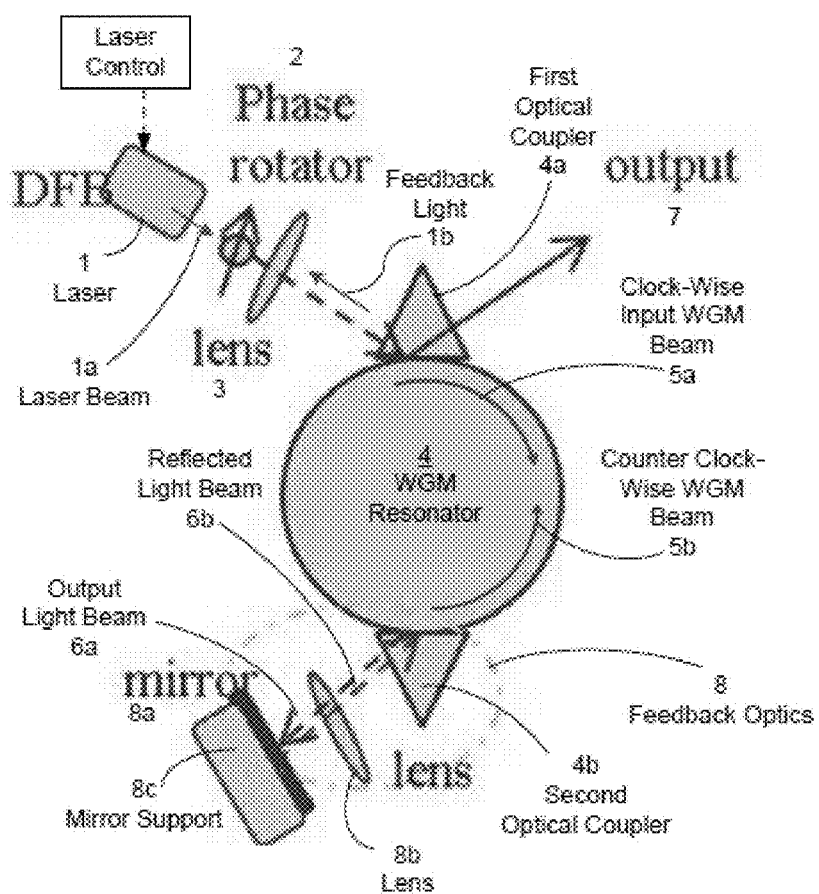
FIG. 1 depicts a schematic of an embodiment of a device that supports injection locking of a laser using an optical resonator.

The following description includes information that may be useful in understanding the present invention. It is not an admission that any of the information provided herein is prior art or relevant to the presently claimed invention, or that any publication specifically or implicitly referenced is prior art.

The inventive subject matter provides apparatus, systems and methods in which a LIDAR system is based upon a FMCW laser light source that is locked to a whispering gallery mode resonator by optical injection. This provides a laser source with an exceptionally narrow linewidth, which (when used in conjunction with a whispering gallery mode optical resonator having controllable optical properties) permits the generation of large bandwidth, highly linear, and highly reproducible chirps by a simple and direct optical mechanism. Such a frequency modulated (FM) LIDAR does not require the use of a separate local oscillator, but can utilize a beam splitter (or functional equivalent) to provide a reference FM signal from the injection locked FMCW laser. Such LIDAR systems can be compact and can be produced economically on a silicon wafer using photolithographic methods. Linearity of the chirps produced in such a system can be less than 10% to less than 0.2%. Bandwidth of the chirps produced can be 10 GHz or greater, the signal to noise ration can be as low as 10 dB with a laser power as low as 3 mW, which can provide a range of up to 200 meters or more.

Various objects, features, aspects and advantages of the inventive subject matter will become more apparent from the following detailed description of preferred embodiments, along with the accompanying drawing figures in which like numerals represent like components.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

One should appreciate that the disclosed techniques provide many advantageous technical effects including the provision of accurate and efficient LIDAR systems, which can be manufactured economically on a single wafer or chip using conventional photolithographic techniques.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

In frequency modulated continuous wave (FMCW) LIDAR, narrow linewidth FM laser light is modulated to provide a frequency ramp, for example an exponential ramp, linear ramp, and or a sigmoidal ramp. Such ramps can be monotonic (i.e. trending in only one direction), bimodal, or multimodal. In some embodiments a linearly ramping frequency ramp generates a linear optical chirp. Such a linear chirp can be transmitted through a beam splitter, and a portion of the chirp emitted. On encountering an object the emitted chirp can be reflected and received by the FMCW LIDAR system as a reflected chirp. This reflected chirp can be combined with a reference chirp obtained from the FM laser (for example, via the beam splitter), for example by translating the received reflected chirp and the reference chirp into FM electrical currents via photodetectors and combining them in an amplifier. The combined signal can be processed (for example using a fast Fourier transform) to characterize differences in phase and/or frequency between the signals, thereby providing measurement of a reflecting object's distance and/or speed. The performance (i.e. range resolution and accuracy) of such an FMCW LIDAR system is directly related to the bandwidth of the frequency ramp, as shown in Formula 1, where ΔR is the range resolution, c is the speed of light, and B is the bandwidth of the emitted frequency chirp:

$$\Delta R = c/2B \qquad \text{Formula 1}$$

Essentially, the greater the bandwidth of the chirp, the better the range resolution. Performance is impacted by the linearity of the frequency ramp or change throughout the chirp, with deviations from linearity resulting in poor reproducibility between chirps. Such linearity is negatively impacted by increasing linewidth of the laser source. If the applied ramp is not highly linear, the quality of the resulting interference data is poor. If a nonlinear frequency ramp is utilized (for example, a sigmoidal change in frequency over time), consistency of the nonlinear function is similarly important. Similarly, variation in the amplitude of the light provided by the laser (relative intensity noise, or RIN) can degrade FM LIDAR performance. Unfortunately, laser sources commonly used for FM LIDAR have relatively large RIN. For an effective system both an extended bandwidth for the modulated frequency of the chirp and high linearity within the chirp are needed. Unfortunately, the greater the bandwidth of a frequency chirp the more difficult it is to linearize it and/or produce it consistently.

Systems and devices of the inventive concept utilize an FMCW laser light source that is optically coupled to an optical resonator that supports whispering gallery modes corresponding to one or more wavelengths emitted by the laser. A portion of the light trapped within the optical resonator as whispering gallery mode frequency is returned to the laser to provide optical injection locking. This serves to both reduce the linewidth of the laser output, but also to reduce RIN by at least a factor of 10 (relative to the source laser without such optical injection locking). The resulting laser output can have extremely narrow linewidths (for example, 1,000 HZ, 500 Hz, 250 Hz, 100 Hz, or less than 100 Hz). Such a laser source can provide linear chirps with large bandwidths (for example, 1 GHz, 5 GHz, 10 GHz, 15 GHz, or more), and can provide a range resolution of (10 cm, 7.5 cm. 5 cm, 2.5 cm, 1 cm, or less than 1 cm). Such range resolutions are useful for a wide variety of applications, including portable devices, autonomous and semi-autonomous transportation, augmented and virtual reality systems, and imaging systems. It should be appreciated that a 15 GHz bandwidth within a linear chirp is equivalent to 150 million times a 100 Hz laser linewidth. Such a signal can be easily discerned, and a high degree of linearization over a large bandwidth can be achieved. For comparison, a prior art system utilizing a typical FM laser with a linewidth of 1 nm would have to be utilize a chirp having a frequency ramp corresponding to some tens of nanometers (for example, 50 nm) to provide adequate distinction, and still would not provide a comparable resolution and signal to noise ratio. It should also be appreciated that linearizing such a 50 nm bandwidth chirp would be extremely technically challenging. Similar issues arise when using a typical prior art laser light source having a linewidth of 100 kHz or more. Inventors have found that the use of a very narrow linewidth laser light source can improve LIDAR performance, while selection of an appropriate method narrowing linewidth while also providing highly controllable and replicatable frequency modulation can simplify the architecture, operation, and ultimately the cost of production of a LIDAR system. In a preferred embodiment, all or at least the majority of the components of a laser light source having the performance characteristics described above and the remaining components of the LIDAR system can manufactured on a silicon chip using photolithographic techniques.

Figure 7A:
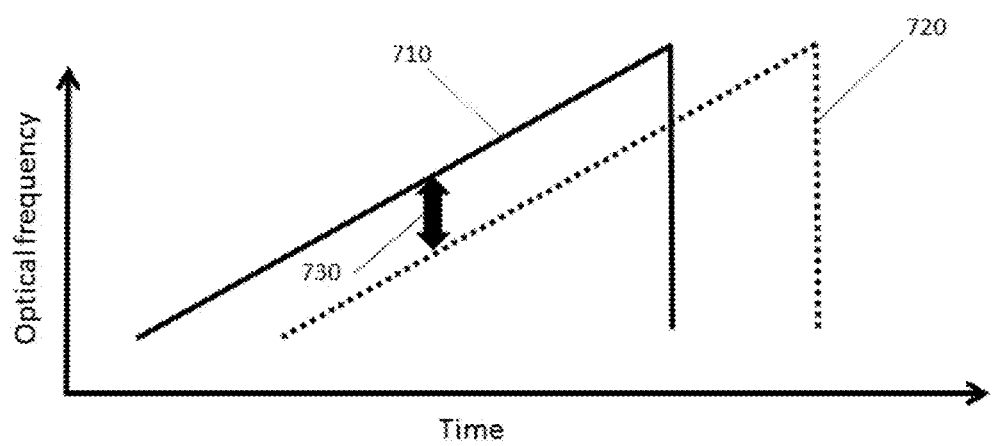
FIGS. 7A and 7B depict emitted and reflected linear, monotonic optical frequency chirps.

The linearity of, for example, a monotonic chirp of increasing frequency, can be expressed as the r value of a correlation between the measured frequency vs ideal frequency for a series of time points for a generated chirp. For example if the desired profile of an optical chirp is as shown in FIG. 7A, which shows a monotonic and linear increase in frequency over time, linearity can be expressed as the correlation between measured and desired or optimal frequency at corresponding time points. In such an example, a perfectly linear generated chirp would be expected to produce an r value of 1 in such a correlation. Deviations from ideal behavior (for example, curvilinear deviation at the beginning and/or end of the chirp, would result in r values that are less than 1. Similar correlation studies can be performed for bimodal chirps and nonlinear (e.g. sigmoidal) chirps. In embodiments of the inventive concept linearity of produced chirps can produce r values greater than 0.8, greater than 0.85, greater than 0.88, greater than 0.9, greater than 0.92, greater than 0.95, greater than 0.97, greater than 0.98, greater than 0.99, and/or greater than 0.995 over the frequency range of the generated chirp.

Similarly, variation between produced chirps should be minimized. Chirps can be characterized by a number of quantifiable factors, including duration, frequency distribution, amplitude, and deviations from linearity (as described above). Variation within a population of chirps can be expressed as a standard deviation and/or coefficient of variation (CV) surrounding a central value for such quantifiable factors. In embodiments of the inventive concept, a CV for duration, frequency distribution, amplitude, and/or deviation from linearity for a statistically significant group of chirps (e.g. greater than 32) can have a C.V. of less than 25%, less than 20%, less than 15%, less than 10%, less than 7.5%, less than 5%, less than 2.5%, less than 1%, less than 0.5%, less than 0.25%, less than 0.2%, and/or less than 0.1%.

In some embodiments of the inventive concept a suitable laser light source for a LIDAR system can be provided by optically coupling a laser light source to an optical resonator. Such an optical resonator can be dimensioned and constructed of materials that support a whispering gallery mode at a wavelength that is emitted by a source laser, and can be constructed of materials (for example electro-optical materials) that permit controlled modulation of an optical property (for example refractive index) of the optical resonator. Modulation of the optical property of the whispering gallery mode resonator (for example, by application of an electrical potential, change of temperature, and/or mechanical pressure) can alter the frequency of the whispering gallery mode. Light can be coupled from an FMCW laser source into a whispering gallery mode by evanescent wave coupling, for example using a prism, an optical fiber with a faceted face, or similar device. Similarly, light from a counterpropagating whispering gallery mode wave within the optical resonator can be coupled out and returned to the source laser to provide optical injection locking, which in turn provides a narrow linewidth laser output. Modulation of the optical property of the optical resonator (for example, via electrodes, a resistive heater, and/or a piezoelectric device) alters the frequency supported by the whispering gallery mode. This in turn alters the frequency utilized for optical injection locking and results in modulating the frequency output of the laser, which continues to have a very narrow linewidth.

As a result in such an arrangement controlled modulation of the optical properties of a whispering gallery mode resonator in optical communication with an FMCW laser (for example, by a chirp generator programmed to produce one or more chirp patterns and intervals) permits direct generation of highly linear (or highly consistently nonlinear) frequency chirps through optical means. The high degree of reproducibility and narrow linewidth of the resulting laser emissions permits the use a simple beam splitter (or similar device) to provide a LIDAR system wherein the modulated FMCW laser serving as the source of an emitted chirp used to characterize a reflecting object can also serve as the source of the reference chirp used to characterize the returning reflected chirp. It should be appreciated that this greatly reduces the complexity and size of the resulting LIDAR system. In some embodiments of the inventive concept highly reproducible frequency chirps can be produced by altering the optical properties of the optical resonator in a controlled fashion, for example by application of current to the optical resonator, application of pressure to the optical resonator, and/or altering the temperature of the optical resonator. It should be appreciated that such an arrangement permits generation of a wide variety of frequency chirp configurations, which can be suitable for different applications.

A variety of configurations are suitable for optically coupling a laser source and a whispering gallery mode resonator in this fashion. One example is shown in FIG. 1, which depicts an arrangement with a set of feedback optics 8. In the arrangement shown in FIG. 1, a source laser 1 provides a laser beam 1*a* that is coupled into a whispering gallery mode resonator 4 (WGM resonator) using a an optical coupler 4*a*, for example a prism. In some embodiments the laser beam is passed through a phase rotator 2 and directed into the optical coupler using a lens 3. A subset of the frequencies represented in the laser beam propagates as a self-reinforcing whispering gallery mode wave 5*a* through the resonator that is "captured" in the whispering gallery mode. A portion of this propagated light is coupled out of the WGM resonator by a second optical coupler 4*b*, and the output light beam 6*b* reflected by a mirror 8*a* (which can be provided on a mount 8*c*) to provide a reflected light beam 6*b*. In some embodiments the output light beam and/or the reflected light beam are directed with a lens 8*b*. The reflected light beam is coupled back into the WGM resonator to form a counterpropagating wave 5*b*. This can be coupled out of the resonator by the first optical coupler and returned to the source laser as a feedback light 1*b*, where optical injection results in a narrowed linewidth laser output 7. The narrowed linewidth output of the source laser can be output through an exposed facet of the first prism and utilized in a LIDAR system.

Figure 2:
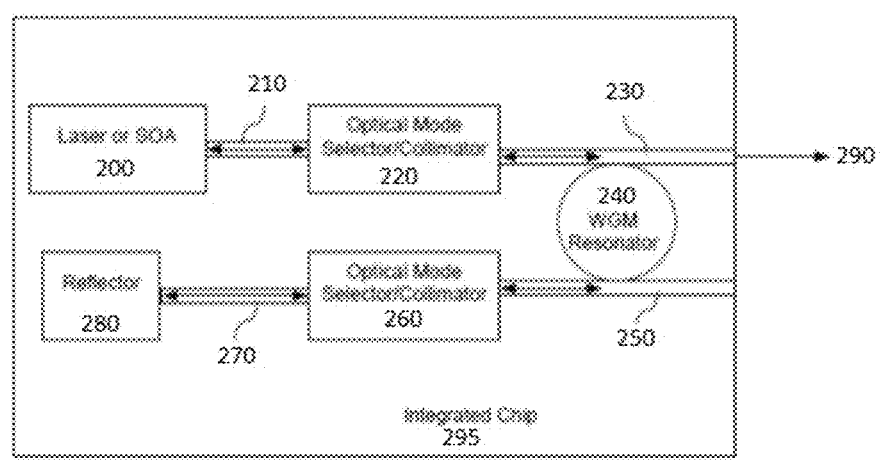
FIG. 2 depicts a schematic of an alternative embodiment of a device that supports injection locking of a laser using an optical resonator.

In other embodiments of the inventive concept, optical coupling between a source laser and an optical resonator and between the optical resonator and a reflector that provides a counterpropagating wave by a waveguide. Suitable waveguides include optical fibers and optically conductive materials provided on silicon wafers. An example of such an embodiment is shown schematically in FIG. 2. As shown, a source laser 200 can be coupled to a whispering gallery mode resonator 240, using one or more waveguides 210, 230. In some embodiments a collimator or optical mode selector 220 can be interposed between the laser and the whispering gallery mode resonator. Light from the laser is coupled into the whispering gallery mode resonator, where light corresponding to the whispering gallery mode(s) is entrapped. At least a portion of the entrapped light is coupled out of the whispering gallery mode resonator to a waveguide 250, where it is directed towards a reflector. In some embodiments a collimator or optical mode selector 260 is interposed between the whispering gallery mode resonator and the reflector, with optical communication provided by an additional waveguide 270. Light returned from the reflector is coupled back into the whispering gallery mode resonator, and back into an optical path that directs it towards the laser. This returning light provides optical injection locking of the laser to a frequency corresponding to a whispering gallery mode of the resonator to provide an laser output 290 with a narrowed linewidth compared to that of the source laser without such optical injection locking. In some embodiments these components can be provided on a single integrated chip 295.

Figure 3:
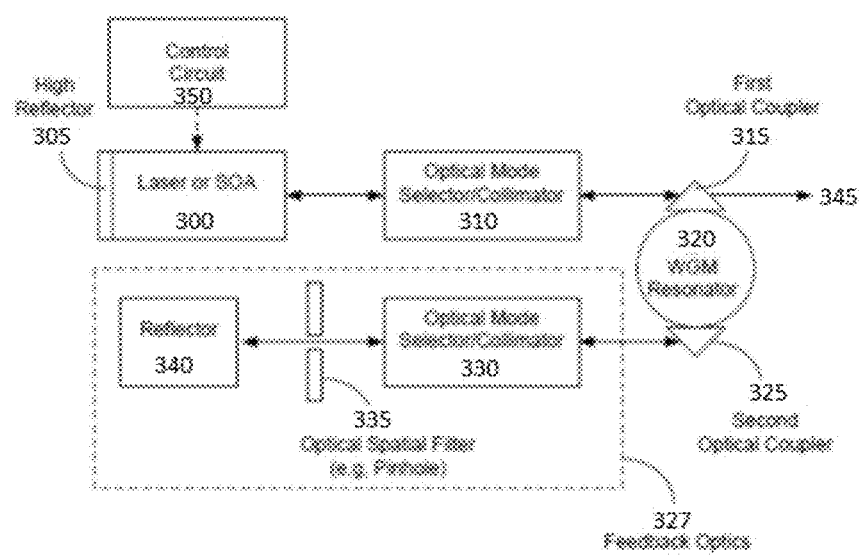
FIG. 3 depicts a schematic of another alternative embodiment of a device that supports injection locking of a laser using an optical resonator.

In some embodiments, optical filters can be incorporated into the device. FIG. 3 shows an example with an optical arrangement similar to that depicted in FIG. 1, but incorporating an optical spatial filter between the second prism and the reflector in order to improve the spatial distribution of the beam. A laser source 300, which can include a reflector 305, provides light that is transferred to a whispering gallery mode resonator 320 by an optical coupler 315. In some embodiments a collimator or optical mode selector 310 is interposed between the laser and the optical coupler. Light corresponding to a whispering gallery mode of the resonator is entrapped within the resonator, and at least a portion is coupled out of the resonator by a second optical coupler 325 and directed to a set of feedback optics 327. These feedback optics can include a reflector 340 and an optical spatial filter 335 (for example, a pinhole) placed between the second optical coupler and the reflector of the feedback optics. In some embodiments a collimator or optical mode selector can be placed between the second optical coupler and the optical spatial filter. Light reflected from the reflector of the feedback optics is coupled back into the whispering gallery mode optical resonator to provide a counterpropagating wave. At least a portion of this counterpropagating wave is transferred out of the whispering gallery mode resonator and directed back towards the laser, providing optical injection that results in a narrowing of the linewidth of the laser. This narrow linewidth output is provided as an output laser beam 345. In some embodiments a control circuit 350 is provided that permits modulation of the laser.

While the examples shown utilize a reflector to provide a counterpropagating wave within the optical resonator, other embodiments of the inventive concept do not require the use of a mirror or reflector. For example, in some embodiments of the inventive concept light scattering within the material of a WGM resonator can provide a counterpropagating wave of sufficient intensity to be useful in optical injection locking of the source laser. In other embodiments features can be introduced into and/or on the surface of a WGM resonator to provide a counterpropagating wave. Suitable features include inclusions within the body of the WGM resonator, pits, channels, or other features generated on the surface of the WGM resonator, and/or an optical grating generated on the surface of the WGM resonator.

Figure 4A:
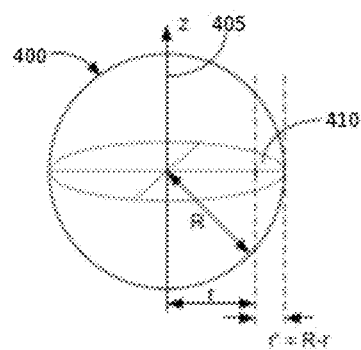
FIGS. 4A to 4D depict configurations for exemplary optical resonators.
Figure 4B:
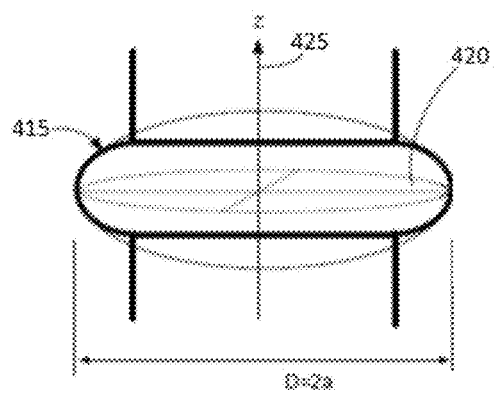
Figure 4C:
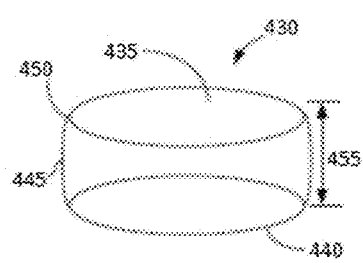
Figure 4D:
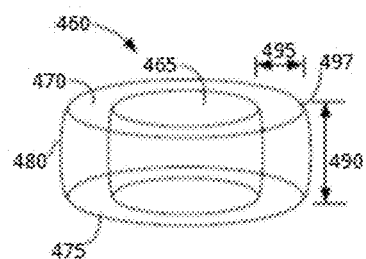

Suitable optical resonators are available in a variety of configurations. As shown in FIGS. 4A, 4B, 4C, and 4D, suitable resonators can configured in a variety of ways. As shown in FIG. 4A, a whispering gallery mode optical resonator 400 can be configured as a sphere, having a circular cross section 410 and extending through a Z axis 405. Alternatively, a whispering gallery mode resonator can be configured as a torus or toroidal solid, as shown in FIG. 4B. In FIG. 4B the whispering gallery mode optical resonator 415 has a circular cross section 420 and extends along the Z axis 425 while having a central aperture. In this example the outer wall of the whispering gallery mode optical resonator has a convex profile, extending outwards from the center. Another example of a suitable configuration for a whispering gallery mode optical resonator is shown in FIG. 4C. In FIG. 4C the whispering gallery mode optical resonator 430 has a disc configuration, with a circular cross section and a height 455 that defines an top surface 435, an outer surface 445, an edge 450, and a lower surface 440. Such an edge can describe an angle of about 90° (e.g. from about 70° to about 90°), and in some embodiments can present as sharp edges. FIG. 4D depicts an alternative toroidal configuration for a whispering gallery mode optical resonator, which resembles a disc with a central aperture. As shown the whispering gallery mode optical resonator 460 can be essentially circular and includes a central aperture 465, with a width 495 defined by the radius of the aperture. Such a whispering gallery mode optical resonator includes an upper surface, 470, a lower surface 475 and an outer wall

480 with a height 490. The edge 497 of the outer wall can have an angle of about 90° (e.g. from about 70° to about 90°), and in some embodiments can be a sharp edge.

Figure 5A:
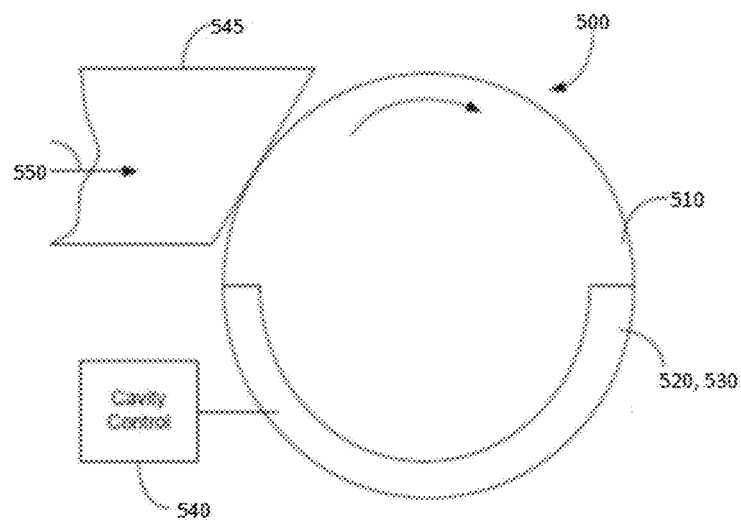
FIGS. 5A and 5B depict placement of electrodes on an optical resonator.
Figure 5B:
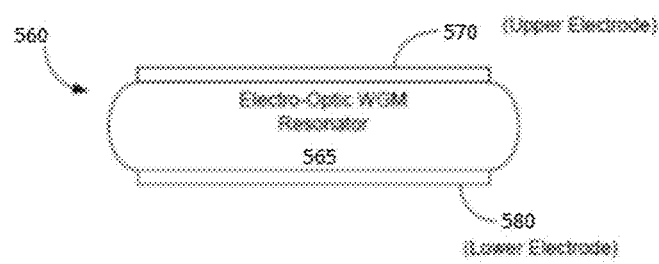

In some embodiments of the inventive concept the whispering gallery mode resonator can be modulated. For example, a whispering gallery mode resonator in a LIDAR system of the inventive concept can be constructed of a material with a refractive index that changes on the application of heat, pressure, and/or electrical potential. In such embodiments a whispering gallery mode resonator can be coupled to a transducer, such as a resistance heater, a piezoelectric device, and/or an electrode. Examples of whispering gallery mode optical resonators that are coupled to transducers in the form of electrodes are shown in FIGS. 5A and 5B. FIG. 5A shows an electronically modulated resonator assembly 500 that includes a whispering gallery mode optical resonator 510 constructed of an electro-optical material, which is in contact with an electrode pair 520, 530. The electrode pair is in electronic communication with a controller 540 that can apply a current and/or voltage potential to the electrode pair, thereby modifying the refractive index of the whispering gallery mode optical resonator (and thereby altering the frequencies supported in whispering gallery mode). Such an assembly can also include an optical interface 545 (e.g. a prism or waveguide with an appropriately angled interface surface) that can transmit incoming light 550 and couple it into the whispering gallery mode optical resonator. It should be appreciated that modulation of such a whispering gallery mode resonator in a LIDAR system of the inventive concept can provide modulation of the laser source that is locked to the whispering gallery mode resonator via optical injection locking. As a result, changes in the refractive index of the optical resonator that result in a change in the frequency supported by the whispering gallery mode can result in injection locking of the source laser at new wavelength while retaining narrow linewidth.

Inventors have found that injection locking of a source laser using light extracted from an optically coupled whispering gallery mode resonator provides a means for generating highly linear optical chirps that incorporate a broad range of frequencies, via modulation of the optical properties of the resonator. As noted above, the optical properties of such resonators can be directly modulated by application of a voltage potential, change in temperature, application of pressure, or a combination of these. Such modulation can alter the frequency supported by the whispering gallery mode(s) of the resonator, thereby altering the frequency utilized for injection locking of the source laser and subsequently locking the laser to the altered frequency. For example, application of a gradient (e.g. a linear, bimodal, and/or sigmoidal gradient) of voltage to such a whispering gallery mode optical resonator over a defined time course results in the generation of an optical chirp corresponding to the applied gradient, through purely optical effects.

In embodiments of the inventive concept the source laser, optical resonator, waveguides for optical coupling of optical components, associated electronic circuitry to power the laser and control the optical resonator, an optical scanning and receiving subsystem, and electronic circuitry providing data analysis can be fabricated on one or more distinct supports (for example, circuit boards, silicon chips, or combinations thereof). For example, a subset of system components (for example, a laser, a whispering gallery mode resonator, and associated optical couplings) can be fabricated on a first support, an optical scanning subsystem fabricated on a second support, control circuitry that directs the activity of the optical resonator and the scanning subsystem fabricated on a third support, and integrated circuits providing conversion of incoming reference and/or reflected chirps into electronic data and for analysis of such electronic data fabricated on a fourth support, with appropriate optical and electronic connections providing communication between these different supports in the assembled system. It should be appreciated that other combinations of system components on two or more supports are contemplated.

In other embodiments all functional elements of the LIDAR system (e.g. a laser and optically coupled whispering gallery mode resonator, optical scanning and receiving subassembly, control circuitry, conversion of incoming reference and/or reflected chirps to electronic data, and data analysis) can be fabricated on a single support (for example, a circuit board or silicon chip). In some embodiments a flip chip fabrication method can be utilized, for example to incorporate a whispering gallery mode resonator. For example, integrated circuitry utilized to generate the electronic signal used to modulate the optical characteristics of the optical resonator can be fabricated on the same silicon chip as the laser and resonator, along with appropriate electrical connections. Components of a beam scanner (for example, a beam scanner incorporating monostatic optics) can be fabricated on the same silicon chip, along with waveguides that provide an optical connection to the frequency modulated laser. Similarly, integrated circuitry utilized to control scan timing (ex. a scan clock) can be fabricated on the silicon chip, along with appropriate electrical connections with the beam canner and the chirp generating circuitry. Optical waveguides can also be fabricated that provide optical communication between the beam scanner and a photocell, in order to provide transcription of a reflected optical chirp into a corresponding electronic return signal. Similar optical waveguides can be fabricated to provide an optical connection between the frequency modulated laser and a second photocell in order to provide transcription of a transmitted optical chirp into a corresponding electronic transmitted signal. Such photocells can be fabricated on a silicon chip, along with electrical connections to a similarly fabricated amplifier. Amplified electronic reflected and transmitted chirp signals can be directed from the amplifier to integrated circuitry that provides fast Fourier transformation of the received signals, with the transformed data transferred to integrated circuitry that processes such data to produce a LIDAR point cloud, with such integrated circuits also fabricated on a common silicon chip. Such a device provides a complete, low power LIDAR device fabricated on a single silicon chip.

A LIDAR system of the inventive concept can include a subassembly that provides a scanning function for directing the transmission of an emitted chirp and a receiving system for receiving an incoming, reflected chirp. A variety of mechanisms are suitable for providing the scanning function, including rotating or gimbal-mounted mirrors, MEMs devices, a set of two or more mirrors mounted on actuators (for example, electric motors, solenoids, and or piezoelectric devices) in a mutually orthogonal fashion, rotating prisms, and/or rotating lenses. An example of a suitable MEMs device is the solid-state tripod mirror mount developed by MinFaros®. In some embodiments a phased array steering device can be used to provide a scanning function. Such a scanning function can be utilized to direct a series of transmitted chirps in a pattern that sweeps an X-Y plane and/or interrogates a three dimensional volume. Such a subassembly can also include a receiving system that intercepts a reflected chirp and directs it (either directly or indirectly via a waveguide or similar device) towards a photocell for conversion to electronic data. Such a receiving system can include a lens and/or mirror that is suitably positioned to intercept and direct a reflected chirp. In some embodiments the position from which the emitted chirp leaves the LIDAR system and the position from which the reflected chirp is received are coaxial. In other embodiments the position from which the emitted chirp leaves the LIDAR system and the position from which the reflected chirp is received are positioned on different optical axes. In a preferred embodiment the position from which the emitted chirp leaves the LIDAR system and the position from which the reflected chirp is received are coaxial and proximal, so as to provide a compact device.

Such compact, light weight FMCW LIDAR systems have wide application in portable devices and other systems where space, weight, and/or power consumption is at a premium. For example, such compact FMCW LIDAR systems can be utilized in piloted, autonomous, and/or semi-autonomous drones, robotic systems, and enhanced reality VR systems. It should be appreciated that such FMCW LIDAR systems can provide information related to not only the position and speed of a reflecting object, but also information related to physical properties such as color, composition, and surface roughness. In this context, the term "position" would usually refer to relative spatial coordinates, but could alternatively be limited to merely a measure of a magnitude of a distance.

Figure 6A:
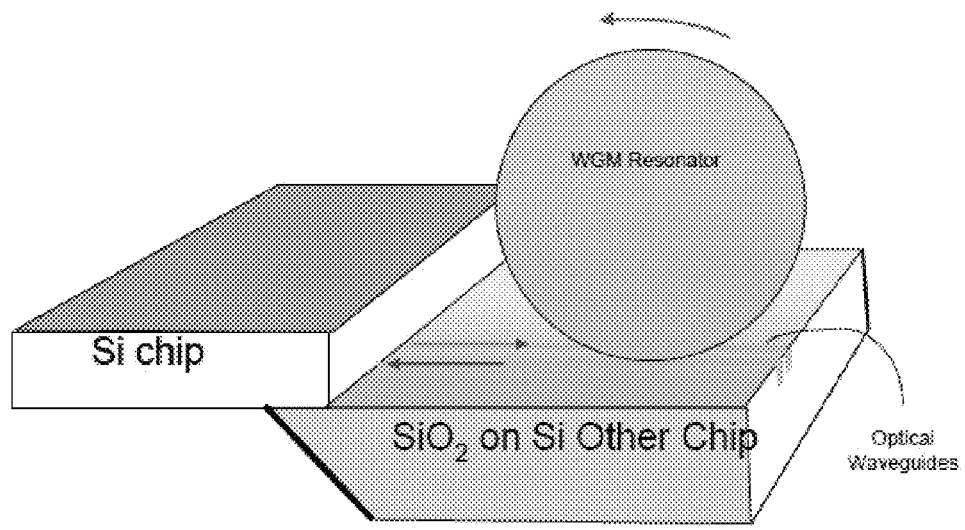
FIGS. 6A to 6D depicts various implementations of an optical resonator integrated into a silicon chip.

As noted above, in preferred embodiments of the inventive concept, all or some of the components of the LIDAR system are provided on a wafer or chip comprising silicon or other appropriate material. Such components can be manufactured using photolithographic methods or a combination of photolithographic and conventional optical manufacturing techniques, including flip chip techniques. Production of the components of processors and photodetectors on silicon surfaces is well known in the electronics industry. Similarly, laser light sources (for example, a diode laser) can also be produced on a silicon substrate. Other optical devices, such as waveguides, can be provided on a silicon substrate, for example by deposition of optically conductive materials using photolithographic methods. Similarly, WGM optical resonators can either be produced on a silicon substrate or introduced to a prepared site on a silicon substrate and used in combination with such components to provide an integrated LIDAR system. One example of such an embodiment is shown in FIG. 6A. In FIG. 6A, optical coupling into and out of a spherical WGM resonator is provided by optical waveguides generated on a silicon wafer or chip using photolithographic techniques. In this example, the WGM resonator is manufactured separately and integrated into the LIDAR chip.

Figure 6B:
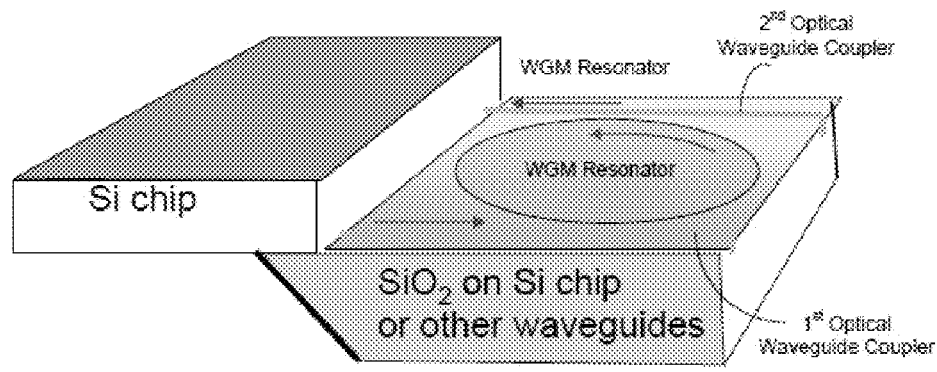

Another example is shown in FIG. 6B. In FIG. 6B, optical coupling into and out of a discoidal WGM resonator is provided by optical waveguides generated on a silicon wafer or chip using photolithographic techniques. In such an embodiment, the discoidal WGM resonator can be manufactured separately and integrated into the LIDAR chip, for example by placement in a cavity generated using photolithography. Alternatively, such a discoidal WGM resonator can be produced on the surface of the silicon wafer or chip using photolithography and suitable dopants and/or deposited optical materials.

Figure 6C:
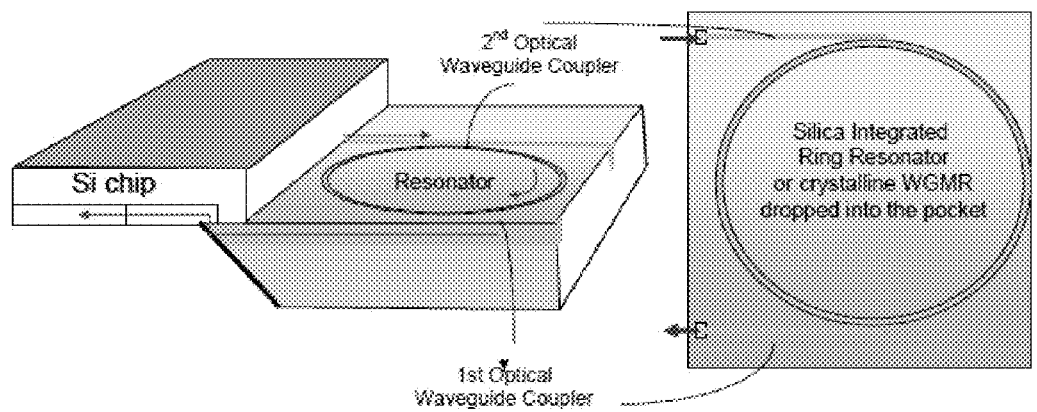

Another example is shown in FIG. 6C. In FIG. 6C, optical coupling into and out of a toroidal or ring-shaped WGM resonator is provided by optical waveguides generated on a silicon wafer or chip using photolithographic techniques. In such an embodiment, the ring-shaped (i.e. a flattened torus) WGM resonator can be manufactured separately and integrated into the LIDAR chip, for example by placement in a channel generated using photolithography. Alternatively, such a ring-shaped WGM resonator can be produced on the surface of the silicon wafer or chip using photolithography and suitable dopants and/or deposition of optical materials.

Figure 6D:
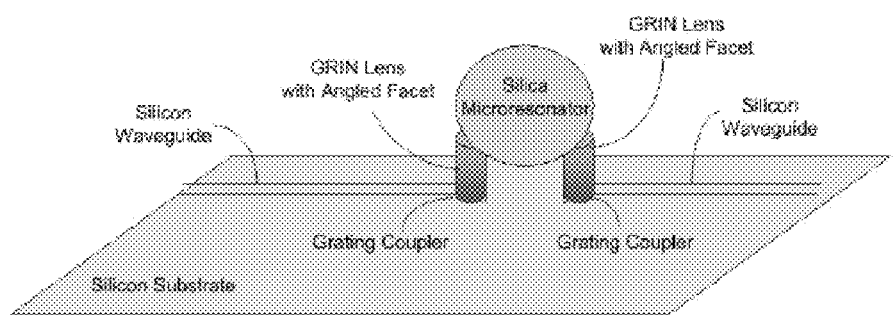

In still other embodiments, a whispering gallery mode resonator can be integrated into a LIDAR system on a silicon wafer or chip using a lensing system. Such lenses can be manufactured on the surface of the silicon wafer or chip by photolithographic techniques or, alternatively, manufactured separately and placed into suitable cavities prepared on the silicon wafer or chip. An example of such an embodiment is shown in FIG. 6D. In FIG. 6D, a silicon waveguide produced on a silicon substrate provides optical communication with a GRIN lens. The GRIN lens can be manufactured separately and affixed to the silicon wafer or chip, or can be produced on the silicon wafer or chip by photolithographic methods. The GRIN lens includes an angled facet. A similar GRIN lens with a similar facet is provided, such that the angled facets of the pair of GRIN lenses are oriented towards each other. A suitable optical resonator is brought into optical communication with the GRIN lens by contacting it to the angled facets. In some embodiments, grating couplers are provided to provide optical communication between waveguides manufactured on the silicon wafer or chip and the GRIN lenses.

Figure 7B:
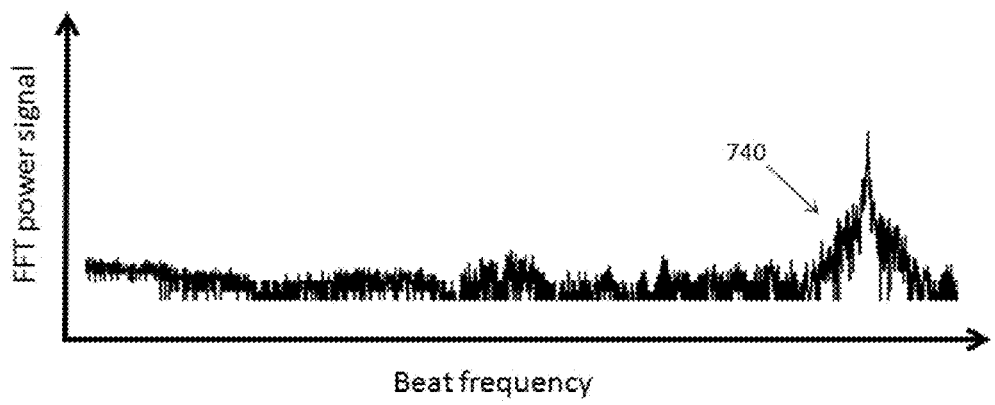

An example of a linear optical frequency chirp suitable for use in LIDAR is shown in FIG. 7A. As shown, an emitted chirp 710 that has a single, increasing trend in optical frequency over time is compared to an identically configured returning optical frequency chirp 720 produced by reflection from a distant object. The difference 730 in frequency measured at a specific time point is characteristic of the distance between the LIDAR emitter and the detected reflecting object. As shown in FIG. 7B, a Fourier Transform analysis of signal power vs beat signal frequency of data derived from such linear, monotonic optical chirps provides a power signal peak 740 that is indicative of the distance between the LIDAR emitter and the detected object.

Figure 8A:
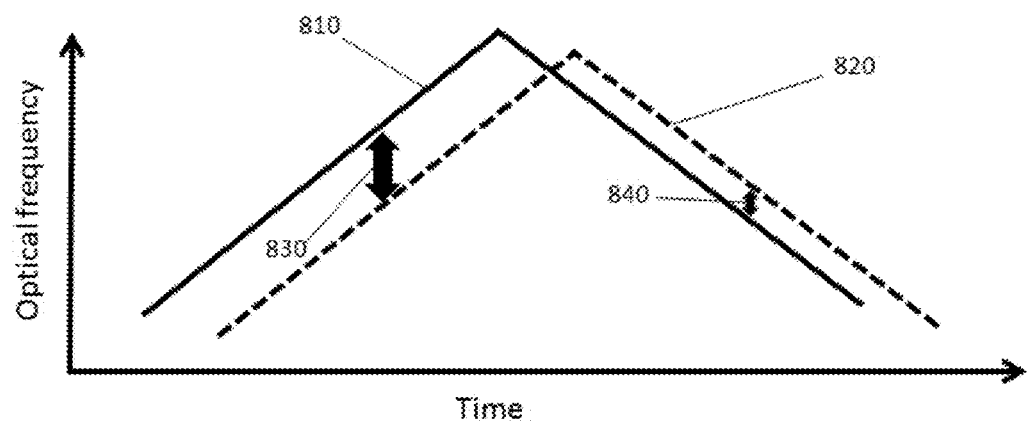
FIGS. 8A and 8B depict emitted and reflected biphasic linear optical frequency chirps.
Figure 8B:
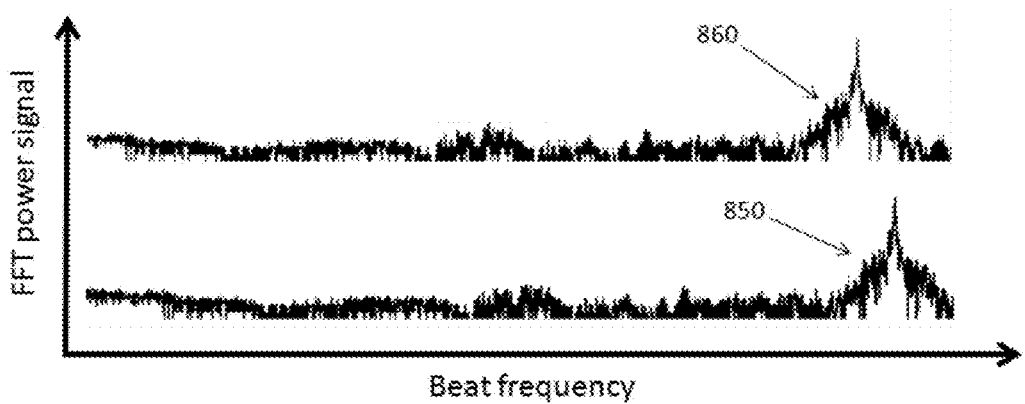

Additional information can be derived from an optical frequency chirp that has a bimodal or Δ configuration, i.e. having an increasing frequency segment and a decreasing frequency segment, joined by an inflection point. An example of the use of such an optical frequency chirp is shown in FIG. 8A. In FIG. 8A an emitted chirp 810 is shown superimposed on a returning, echoed chirp 820. Different sets of frequency differences 830,840 are associated with the ascending frequency limb and the descending frequency limb of the chirp. In such an embodiment, the ascending limb difference 830 can be associated with the distance between the LIDAR emitter and the reflecting object, while the descending limb difference 840 can be associated with the relative velocity between the LIDAR emitter and the reflecting object. As shown in FIG. 8B a Fourier Transform analysis of signal power vs beat signal frequency of data derived from such optical chirps provides a power signal peak 860 that is indicative of the distance between the LIDAR emitter and the detected object and a second signal power vs beat signal frequency peak 850 that is indicative of the relative velocity between the LIDAR emitter and the reflecting object.

Figure 9:
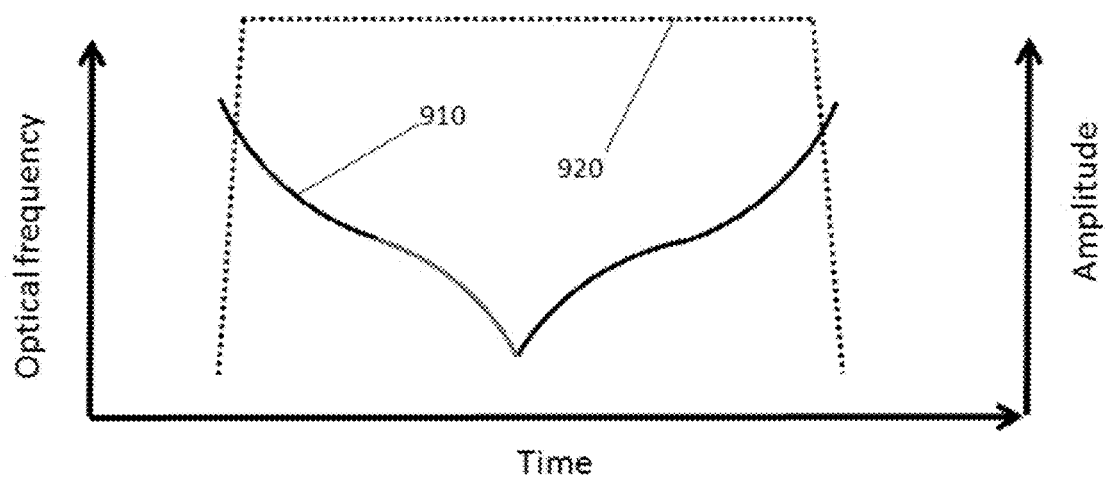
FIG. 9 depicts a complex biphasic optical frequency chirp, where frequency varies with time in a sigmoidal fashion.

FIGS. 7A and 8A depict optical frequency chirps that show linear changes in optical frequency over time, however as shown in FIG. 9 a device of the inventive concept can produce an optical frequency chirp with a nonlinear configuration. As shown, such an optical frequency chirp can have a first segment showing a sigmoidally trending change in optical frequency over time and a second segment showing a symmetric (the oppositely oriented) sigmoidally trending change in optical frequency over time. As shown, such an optical frequency chirp 910 can also change in amplitude 920 during the duration of the chirp (for example, increasing rapidly in amplitude during the initial portion of the optical frequency chirp and decreasing rapidly in amplitude over the final portion of the optical frequency chirp). Inventors have found that the use of such optical frequency chirps provides improved resolution and signal to noise ratios, while reducing lobe formation.

Figure 10:
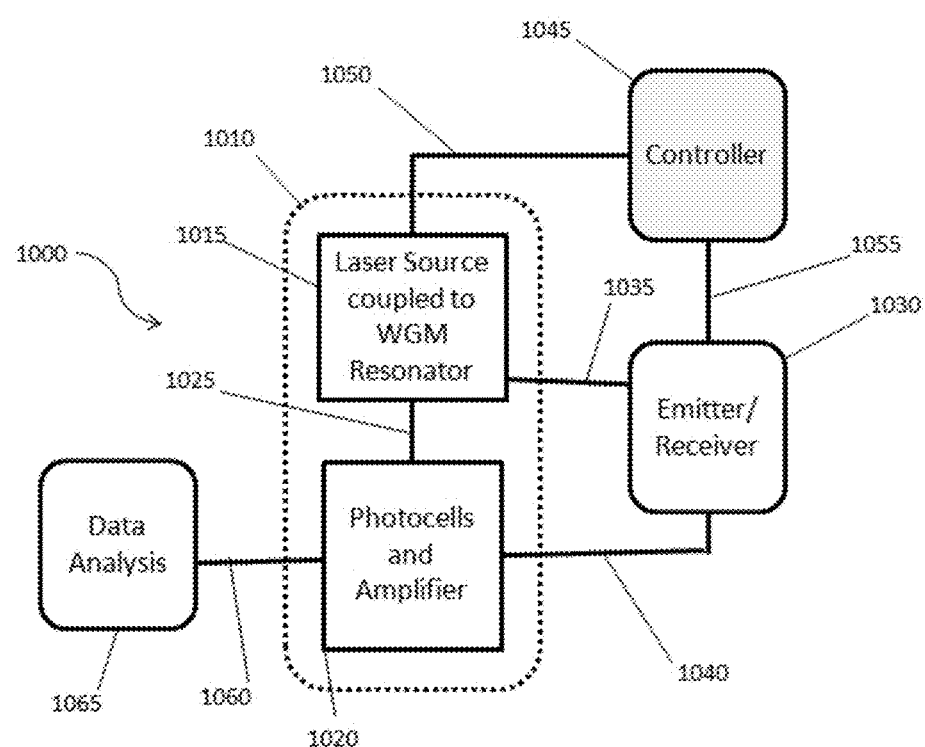
FIG. 10 schematically depicts a LIDAR system of the inventive concept.

FIG. 10 provides a schematic depiction of an FMCW LIDAR system of the inventive concept. In some embodiments of the inventive concept such a system can be divided into two or more subsystems. In the example shown, the FMCW LIDAR 1000 is divided into four subsystems. One subsystem 1010 can include a laser assembly 1015 that includes a laser source that is optically coupled to a modulatable WGM resonator to provide a narrow linewidth laser output, and also includes a detector assembly 1120 that includes at least two photocells and an amplifier that can serve to integrate the outputs from the photocells in the form of electronic data. An optical transfer device 1025 (for example, a waveguide) provides optical communication between the laser assembly and the detector assembly. In some embodiments that laser assembly and the detector assembly can be present as separate and distinct subsystems.

The laser assembly 1115 is also in optical communication 1035 with an emitter/receiver subassembly 1030 that includes an emitter that transmits an optical chirp generated by the laser assembly into the environment, and a receiver that receives reflected chirps. The receiver is similarly in optical communication 1040 with the detector assembly1020. A controller subassembly 1045 can provide control functions to the laser assembly 1015 and/or the emitter/receiver subassembly 1030. For example, electronic communication 1050 between the controller subsystem 1045 and the laser assembly 1015 can provide modulation of the WGM optical resonator (for example, via a resistive heater, one or more piezoelectric actuator(s), and/or one or more electrical contact(s) to generate an optical chirp. Such a controller subsystem can also be in electronic communication 1055 with an emitter/receiver subsystem 1030 in order to provide control over operations related to direction and/or scanning of the emitted chirp. Such a controller subassembly 1045 can also control the functions of additional components, such as one or more optical switches that are integrated into lines of optical communication. In some embodiments separate and distinct controller subassemblies can be used to control different aspects of the FMCW LIDAR system. For example, separate controller subassemblies can be utilized to control the laser assembly 1015 and the emitter/receiver subassembly 1030.

Electronic data provided by the detector system 1020 is also provided with electronic communication 1060 with a data analysis subsystem 1065. Such a data analysis subsystem can include one or more processing modules, which can incorporate one or more microprocessors. Examples of suitable microprocessors include members of the SnapDragon® chips from QualComm®. For example, the data analysis subsystem 1065 can include a fast Fourier transform module for initial processing of combined data from reflected chirps received from the environment and a reference, non-reflected chirp. The transformed data from such a fast Fourier transform module can then be provided to a processing module for derivatization of spatial coordinates and/or velocity of a reflective surface that provided the reflected chirp. Such a processing module can also derive secondary information regarding properties of the reflective surface (for example, color, composition, texture, etc.). The data analysis subsystem 1065 can store and/or transmit such data derived from one or more reflected chirps in the form of a point cloud (i.e. a collection of data points representing spatial coordinates of reflecting surfaces). Such a point cloud can also encode information related to velocity and/or secondary information.

In some embodiments of the inventive concept all subassemblies depicted in FIG. 10 are provided on a single operational surface (e.g. a circuit board, a silicon chip, etc.). In other the subassemblies can be distributed among two or more operational surfaces. In still other embodiments each subassembly is provided on a unique operational surface. In embodiments in which subassemblies are distributed among different operational surfaces, communication can be provided using a physical medium (for example, a wire or lead) or can be provided by wireless communication (for example, WiFi, Bluetooth, IR, RF, etc.). Such wireless communications can be utilized in a distributed FMCW LIDAR system, where subassemblies are not collocated.

In some embodiments, a LIDAR of the inventive concept is integrated into a vehicle assistance system. In such an embodiment the LIDAR integrated into or mounted on (or in) a mobile vehicle (for example, an automobile, an aircraft, a drone, and/or a watercraft). In such an embodiment FMCW LIDAR can provide spatial data related to position and/or velocity of reflecting objects within the scanning range of the LIDAR system. Such a scanning range can represent a plane and/or a volume, depending upon the configuration of the LIDAR system. Such data can be represented as a point cloud, wherein each point represents at least 2D or 3D spatial coordinates related to a reflecting object. In some embodiments characteristics of the reflected chirp (for example, amplitude and/or intensity) can provide information related to additional characteristics of the reflecting object (for example, composition, color, surface texture, etc.). Values for such additional characteristics can be encoded in the points of the point cloud.

Such point cloud data can be utilized by on-board or off-board processors to provide assistance to the operation of vehicles so equipped. In some embodiments such assistance can be in the form of warnings and/or prompts that are provided to a vehicle operator. Such a vehicle operator can be present in the vehicle, or can be piloting the vehicle remotely. In some embodiments assistance to a vehicle operator can be provided in the form of automated vehicle responses. Examples of automated vehicle responses include changes in speed (e.g. accelerating, decelerating, braking, etc.), altitude, and/or direction. Such automated vehicle responses can be provided following prompting of the vehicle operator or in an autonomous fashion. In some embodiments such automated vehicle responses can override control of the vehicle provided by the vehicle operator, for example when detected conditions meet certain criteria. Examples of such criteria include determination that a detected condition can result in injury to an operator and/or a detected individual, vehicle damage or loss, or require action that is more rapid than can be provided by the operator.

In other embodiments of the inventive concept such point cloud data can be utilized by on-board or off-board processors to provide a vehicle so equipped with the capability to operate autonomously. In some embodiments such an autonomous functionality can be at the discretion of an onboard or remote vehicle operator. In such embodiments the vehicle can be directed by the vehicle operator during part of its operation (for example, take off, landing, heavy pedestrian traffic, etc.) and operate autonomously under other conditions. In other embodiments a vehicle so equipped operates wholly autonomously. Such an autonomous vehicle can be configured to carry passengers (i.e. persons not involved in operating the vehicle), or can be designed to operate without a human presence.

Figure 11:
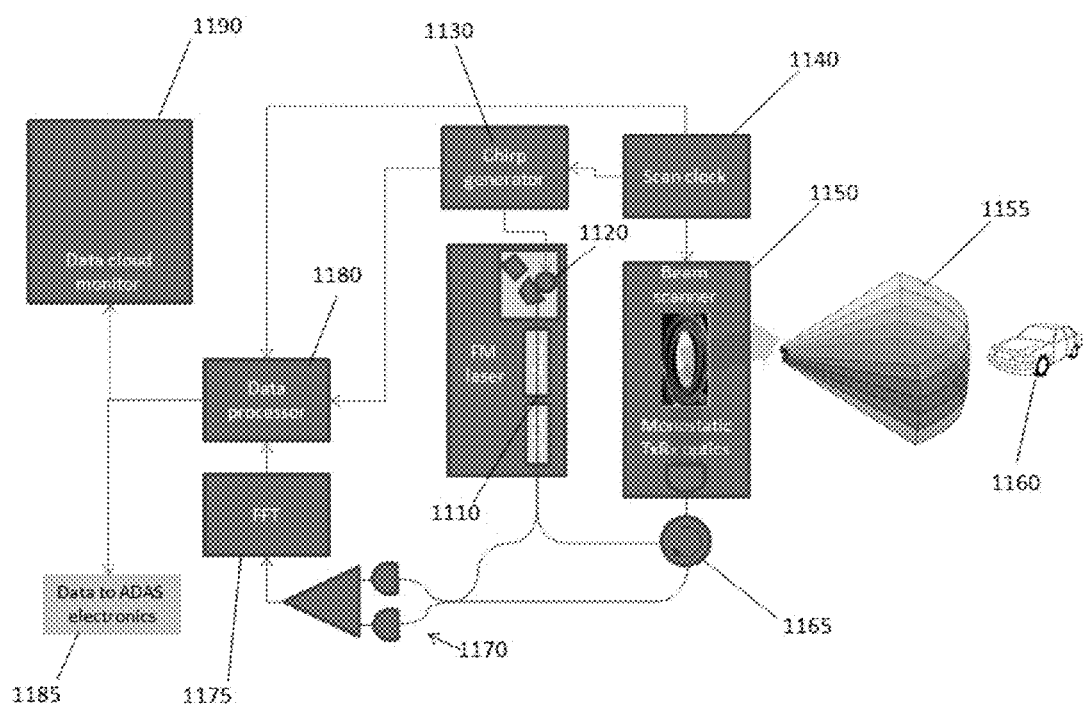
FIG. 11 schematically depicts an Automated Driving Assistance System (ADAS) incorporating a LIDAR of the inventive concept.

As shown in FIG. 11, a LIDAR of the inventive concept can be incorporated into an Advanced Driver Assistance System (ADAS). Such systems provide automated/adaptive and/or enhanced vehicle systems that improve safety while driving. Such systems are designed to avoid collisions and accidents, by utilizing technologies that alert a driver to potential problems, or to avoid collisions by assuming control of the vehicle. ADAS can provide adaptive features such as automated lighting, adaptive cruise control, and automated braking, and can incorporate GPS/traffic warnings, connect with a smartphone and/or a data cloud. Such systems can alert a driver to the presence and/or proximity of other vehicles or obstacles, keep the vehicle in a desired traffic lane, and/or provide a driver with a display of what is not visible via the vehicle's mirrors.

LIDAR devices of the inventive concept can provide an essential part of an improved ADAS by providing a compact device that provides highly accurate information related to the presence, position, and/or speed of other vehicles and of road obstacles. FIG. 11 depicts an embodiment of a LIDAR of the inventive concept that is configured for incorporation into an ADAS. As shown, an ADAS equipped vehicle can include an FM laser that is optically coupled to a optical resonator such that the FM laser is locked to the optical resonator by optical injection. Output of the FM laser is modulated to provide optical frequency chirps by a chirp generator that is in communication with the optical resonator. Modulating the optical properties of the optical resonator provides the frequency modulation of the optical frequency chirp via optical injection locking. Optical frequency chirps are provided to a beam scanner that directs the optical frequency chirp outwards and collects the returning echoes.

An example of an FMCW LIDAR of the inventive concept that can be incorporated into an ADAS is shown in FIG.11. As shown in FIG. 11, an FM laser 1110 is optically coupled to an optical resonator 1120. The optical resonator can support one or more whispering gallery modes that serve to entrap and/or accumulate light within the resonator. Whispering gallery modes can correspond to one or more wavelengths of light produced by the FM laser. Light from the laser can be coupled into the optical resonator by any suitable means, for example a prism or optical fiber. Light is coupled out of the optical resonator 1120 to provide optical injection locking of the FM laser 1110, substantially reducing its linewidth. The optical properties of the optical resonator can be changed (for example by heat via a resistance heater, pressure via a piezoelectric device, and/or the application of a voltage potential via an electrode), altering the wavelength associated with a whispering gallery mode. Such an alteration is fed back to the FM laser via injection locking to alter the output frequency of the FM laser 1110.

As shown, a chirp generator 1130 is in communication with the optical resonator 1120. Such a chirp generator can be configured to produce one or more chirp patterns of frequency vs time that are useful in LIDAR applications. Examples of suitable chirp patterns are described above and shown in FIGS. 7A, 8A, and 9. Variation of the optical properties of the optical resonator 1120 over time by the chirp generator 1120 results in the emission of optical frequency chirps from the FM laser via injection locking of the FM laser to the optical resonator. Such optical chirps can be transmitted to other system components, for example using one or more optical fibers. In the example shown in FIG. 10, the optical frequency chirp generated by the FM laser 1110 is split into retained and transmitted optical frequency chirps, for example using a beam splitter. The transmitted optical frequency chirp is directed, via an optical switch 1165 to an optical scanner 1150. Such an optical scanner can have both optical transmission and optical receiving functions, and can utilize monostatic transmission/reception (Tx/Rx) optics. Coordination for these activities is provided, at least in part, by a scan clock 1140 that is in communication with both the optical scanner 1050 and the chirp generator 1130. Such a scan clock can provide a consistent scanning rate and or chirp generation rate, or can adjust the scanning and/or chirp generation rate depending on environmental and/or traffic conditions. The transmitted optical frequency chirp is emitted from the scanner 1150 are can be returned as a reflected chirp from a reflective object 1160 that lies within a scanning volume 1155 that defines the effective range of the LIDAR.

Reflected chirps reflected from the reflective object 1060 are directed by the scanner 1150 to a photocell/amplifier assembly 1170. A photocell of the photocell /amplifier assembly converts the reflected optical frequency chirp to a corresponding electrical signal that is amplified in the amplifier portion of the assembly. The same photovoltaic cell/amplifier assembly receives the corresponding retained chirp at a different photovoltaic cell, where it is converted into a corresponding electrical signal that is similarly amplified.

Amplified electrical signals corresponding tot eh reflected chirp and the retained chirp are processed in a fast Fourier transform engine 1175 and the resulting processed data provided to a data processing engine 1180 for estimation of distance between the LIDAR emitter and the reflective object, relative velocity between the LIDAR emitter and the object, and any other relevant and derivable information. Data related to these parameters can be provided to an ADAS engine 1185 associated with vehicle and/or a point cloud 1190. Such a point cloud 1090 can serve as a repository for Cartesian coordinate and point attributes derived from the LIDAR system. Such point attributes can include scan angle, intensity of the returned signal, and other characteristics of the returned signal. Such data can be used to generate a model of the surrounding environment, which can in turn be provided to the ADAS. Alternatively, data stored in the point cloud 1190 can be accessed by a third party for imaging purposes, to derive information related to traffic patterns, etc.

The ADAS engine 1185 can utilize data related to the distance and relative speed of reflective objects outside of the vehicle to notify a vehicle occupant (for example, a driver) and/or act directly on vehicle systems. In some embodiments the ADAS engine provides a notification to a vehicle occupant. Such a notification can be an audible alarm or warning, for example transmitted through a speaker of the vehicle's audio system, a separate audio system, and/or an earpiece worn by the vehicle operator. In other embodiments the notification can be provided by a visual display that can be seen by a vehicle occupant. Such a visual display can include a dedicated display for this purpose, a display of the vehicle's navigation system, a display integrated into a mirror of the vehicle, and/or a "heads up" display reflected from the interior of a vehicle window.

In other embodiments the ADAS engine 1185 can provide instructions to systems that influence the movement of the vehicle directly. For example, the ADAS engine can provide instructions that trigger an actuator that manipulates components of the vehicle's brake system, steering system, and/or engine accelerator. In such an embodiment the system can augment a vehicle operator's actions or, alternatively, permit the vehicle to operate in an autonomous or semi-autonomous fashion. In other embodiments the ADAS engine can provide instructions to a vehicle system that is, at least in part, operating the vehicle. For example, such an ADAS engine can provide instructions to a cruise control system, which in turn provides instructions to actuators coupled to various vehicle operating components. Alternatively, such an ADAS system can provide instructions to an autonomous driving system that operates the vehicle without the benefit of a vehicle operator.

Although FIG. 11 shows an application of a LIDAR of the inventive concept to an ADAS, it should be appreciated that it has utility in numerous other applications. Examples include remote piloted and autonomous drones, agriculture, forestry, terrain mapping, warehouse management, augmented and virtual reality (VR) systems, construction, and structural sensors.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A LIDAR system comprising:
a laser light source configured to transmit a first range of frequencies characterized by a first linewidth along a first optical path;
a whispering gallery mode resonator that is optically coupled to the laser light source to receive light emitted by the laser light source, wherein the whispering gallery mode resonator is configured to provide a whispering gallery mode corresponding to a second range of frequencies, wherein the second range of frequencies is narrower than the first range of frequencies, such that a propagating wave at the second range of frequencies is circulated within the whispering gallery mode resonator, wherein at least a portion of the propagating wave is optically coupled out of the whispering gallery mode resonator and provides injection locking of the laser light source to provide a locked laser light source;
a transducer coupled to the whispering gallery mode optical resonator and configured to alter an optical property of the whispering gallery mode optical resonator;
a controller that is operationally coupled to the transducer;
a transmission assembly configured to direct a transmitted optical chirp out from the LIDAR system; and
a receiver assembly configured to receive a reflected optical chirp; and
a processor configured to determine position of an external object relative to the LIDAR system on the basis of a characterization of the reflected chirp.

2. The LIDAR system of claim 1, wherein the laser light source is locked to the whispering gallery mode resonator by optical injection.

3. The LIDAR system of claim 2, wherein the linewidth of the locked laser light source is 1000 Hz or less.

4. The LIDAR system of claim 1, wherein in the transmitted optical chirp is characterized by a linear gradient of frequencies within the bandwidth.

5. The LIDAR system of claim 4, wherein the linear bandwidth is at least 15 GHz.

6. The LIDAR system of claim 1, wherein the LIDAR system has a spatial resolution of 1 cm or less.

7. The LIDAR system of claim 1, wherein the controller is configured to generate a linear gradient of optical property in the whispering gallery mode resonator over time.

8. The LIDAR system of claim 1, wherein the optical property is refractive index.

9. The LIDAR system of claim 1, wherein the transducer is selected to provide a transducing force selected from at least one of the group consisting of electrical potential, temperature change, and pressure to the whispering gallery mode generator.

10. The LIDAR system of claim 1, further comprising two or more photovoltaic transducers that are in optical communication with the receiver assembly, and wherein the two or more photovoltaic transducers are fabricated on the common substrate.

11. The LIDAR system of claim 10, wherein the processor comprises a fast Fourier transform engine that is communicatively coupled to the photovoltaic transducers.

12. The LIDAR system of claim 11, wherein the processor comprises a data processor that is communicatively coupled to the Fourier transform engine.

13. The LIDAR system of claim 11, wherein the LIDAR system further comprises a beam splitter interposed between the laser source and the transmission assembly, wherein the LIDAR system utilizes an output of the laser light source as a reference chirp.

14. The LIDAR system of claim 1, wherein the transmitter assembly and the receiver assembly are arranged in a monostatic fashion.

15. The LIDAR system of claim 1, wherein the laser light source, the whispering gallery mode resonator, the transducer, the controller, the transmission assembly, the receiver assembly, and the processor are fabricated on a common substrate.

16. A method of utilizing a LIDAR system, comprising:
providing a laser light source configured to transmit a first range of frequencies characterized by a first linewidth along a first optical path;
providing a whispering gallery mode optical resonator that is optically coupled to the laser light source by a first optical coupling, wherein the whispering gallery mode resonator is configured to provide a whispering gallery mode corresponding to a second range of frequencies, wherein the second range of frequencies is narrower than the first range of frequencies, such that a propagating wave at the second range of frequencies is circulated within the whispering gallery mode resonator;

providing a second optical coupling configured to direct at least a portion of the propagating wave to a reflecting feature along a second optical path;

returning light reflected back along the second optical path to the whispering gallery mode resonator as a counterpropagating wave;

directing, by the first optical coupling, at least a portion of the counterpropagating wave back along the first optical path to the laser light source, such that the laser light source is locked to the whispering gallery mode resonator by optical injection;

using a controller that is operationally coupled to the optical resonator to produce an optical chirp from the laser light source;

transmitting, by a transmission assembly source, the optical chirp out from the LIDAR system;

receiving, by a receiver assembly, a reflected optical chirp; and using processor source to determine position of an external object relative to the LIDAR system on the basis of a comparison between a reference chirp generated by the laser light source and the reflected chirp.

17. The method of claim 16, wherein the laser light source is locked to the whispering gallery mode resonator by optical injection.

18. The method of claim 17, wherein the linewidth of the locked laser light source is 1000 Hz or less.

19. The method of claim 16, wherein in the optical chirp is characterized by a linear change in frequency over the bandwidth.

20. The method of claim 19, wherein the bandwidth is at least 15 GHz.

21. The method of claim 16, wherein the LIDAR system has a spatial resolution of 1 cm or less.

22. The method of claim 16, wherein the laser light source, the optical resonator, the transmission assembly, the receiver assembly, and the processor are on a common silicon substrate.

23. A vehicle assistance system comprising:
a LIDAR subassembly that is collocated with a vehicle, comprising (1) a laser light source configured to transmit a first range of frequencies characterized by a first linewidth along a first optical path, (2) a whispering gallery mode optical resonator that is optically coupled to the laser light source by a first optical coupling, wherein the whispering gallery mode resonator is configured to provide a whispering gallery mode corresponding to a second range of frequencies, wherein the second range of frequencies is narrower than the first range of frequencies, such that a propagating wave at the second range of frequencies is circulated within the whispering gallery mode resonator, (3) a second optical coupling configured to direct at least a portion of the propagating wave to a reflecting feature along a second optical path, and to return a light reflected back along the second optical path to the whispering gallery mode resonator as a counterpropagating wave, wherein the first optical coupling is additionally configured to direct at least a portion of the counterpropagating wave back along the first optical path to the laser light source, (4) a controller that is operationally coupled to the optical resonator and is configured to produce an optical chirp from the laser light source, (5) a transmission assembly configured to transmit the optical chirp out from the LIDAR system, (6) a receiver assembly configured to receive a reflected optical chirp, and (7) a processor configured to generate LIDAR data related position of an external object relative to the LIDAR system on the basis of a comparison of a reference chirp with the reflected chirp, wherein the reference chirp is produced by the laser light source; and an assistive engine that receives the LIDAR data and is in communication with a vehicle effector.

24. The vehicle assistance system of claim 23, wherein the effector comprises a notification system, and wherein output from the notification system is positioned to be perceived by a vehicle operator.

25. The vehicle assistance system of claim 24, wherein the notification system comprises a display.

26. The vehicle assistance system of claim 24 wherein the notification system comprises an audio transducer.

27. The vehicle system of claim 23 wherein the effector is coupled to an actuator, and wherein the actuator is further coupled to a drive component of the vehicle.

28. The vehicle assistance system of claim 27 wherein the drive component is selected from the group consisting of a steering mechanism, a braking mechanism, an accelerator mechanism, an elevator, an aileron, a rudder, a blade pitch adjustment mechanism, a motor or engine speed adjustment mechanism, and a transmission mechanism.

29. The vehicle assistance of claim 23, wherein the effector comprises a cruise control or an autopilot.

30. The vehicle assistance system of claim 23, wherein the vehicle is at least partially controlled by an operator.

31. The vehicle assistance system of claim 30, wherein the operator is located remotely from the vehicle.

32. The vehicle assistance system of claim 23, wherein the vehicle is autonomous.

33. The vehicle assistance system of claim 23, wherein the vehicle is selected from the group consisting of an automobile, an aircraft, a watercraft, and a drone.

* * * * *